(12) United States Patent
Hsieh et al.

(10) Patent No.: US 7,663,437 B2
(45) Date of Patent: Feb. 16, 2010

(54) LOW FLICKER NOISE OPERATIONAL AMPLIFIER

(75) Inventors: Hong Yean Hsieh, Kaohsiung (TW); Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/101,203

(22) Filed: Apr. 11, 2008

(65) Prior Publication Data

US 2008/0252373 A1 Oct. 16, 2008

Related U.S. Application Data

(60) Provisional application No. 60/912,160, filed on Apr. 16, 2007.

(51) Int. Cl.
*H03F 3/45* (2006.01)

(52) U.S. Cl. .................................. 330/252; 330/253
(58) Field of Classification Search ......... 330/252–253, 330/255, 283
See application file for complete search history.

(56) References Cited

U.S. PATENT DOCUMENTS

| 6,194,962 B1 * | 2/2001 | Chen ........................... 330/9 |
| 7,411,451 B2 * | 8/2008 | Alenin et al. ............... 330/252 |

* cited by examiner

*Primary Examiner*—Robert Pascal
*Assistant Examiner*—Hieu P Nguyen
(74) *Attorney, Agent, or Firm*—IPR Works, LLC

(57) ABSTRACT

A low flicker noise operational amplifier comprises two circuit branches of the same topology and a plurality of current source pairs. For each current source pair, the two current sources are commutatively steered into the two circuit branches via two sets of differential pair in a manner controlled by a pair of complementary logical signal.

14 Claims, 4 Drawing Sheets

LOW FLICKER NOISE OPERATIONAL AMPLIFIER

CROSS REFERENCE TO RELATED APPLICATIONS

This application claims the benefit of U.S. Provisional Application No. 60/912,160, filed on Apr. 16, 2007 and entitled "LOW FLICKER NOISE OPERATIONAL AMPLIFIER", the contents of which are incorporated herein by reference.

FIELD OF THE INVENTION

The invention is related to operational amplifier. In particular, this invention relates to an apparatus and method for reducing flicker noise of operational amplifier.

BACKGROUND OF THE INVENTION

Flicker noise, also known as 1/f noise, is a low frequency noise that is commonly observed in semiconductor devices such as MOS (metal-oxide semiconductor) field-effect transistors. As the name suggests, the power spectral density of a 1/f noise at a given frequency is inversely proportional to the frequency. Therefore, the power spectral density of the flicker noise is very high at a very low frequency. For applications where the signal of interest contains low frequency components, such as audio analog-to-digital converters and direct down-conversion receivers, one usually needs to use a low flicker noise operational amplifier, otherwise the desired signal could be spoiled by an excessively high flicker noise. A prior art differential operational amplifier is shown in FIG. 1 (bias circuits are not shown in the figure). This operational amplifier is a folded cascode amplifier comprising a bias transistor $M_0$, a differential pair $M_1$ and $M_2$, a pair of cascode transistors $M_3$ and $M_4$, another pair of cascode transistors $M_5$ and $M_6$, a pair of P-type current sources $I_p^+$ and $I_p^-$, and a pair of N-type current sources $I_n^+$, and $I_n^-$. The basic idea of the folded cascode structure is to use a differential pair of transistors of one type to amplify the input differential signal, and use a pair of cascode transistors of the opposite type to boost the output resistance of the differential pair. In this folded cascode amplifier, the differential-pair transistors consisting of $M_1$ and $M_2$ are PMOS (P-type MOS) transistors, whereas the cascode transistors consisting of $M_3$ and $M_4$ are NMOS (N-type) transistors. This arrangement of using opposite-type cascode transistors allows its output to have larger swing ranges than using cascode transistors of the same type. Note that each of the two P-type current sources $I_p^+$ and $I_p^-$ comprises a PMOS transistor, and each of the two N-type current sources $I_n^+$ and $I_n^-$ comprises a NMOS transistor. In this operational amplifier, the two P-type current sources $I_p^+$ and $I_p^-$ and the two N-type current sources $I_n^+$ and $I_n^-$ are major contributors of flicker noise. What is needed is a method to alleviate the adverse effect of the flicker noise generated by these devices.

SUMMARY OF THE INVENTION

Therefore, one of the objectives of the present invention is to provide a signal transmitting system with unequal transmission paths and a method thereof to solve the above-mentioned problems.

In one embodiment, an operational amplifier is disclosed, the operational amplifier comprising two circuit branches of the same topology and a plurality of current source pairs, wherein: for each current source pair, the two current sources are commutatively steered into the two branches via two sets of differential pair in a manner controlled by a pair of complementary logical signal. In an embodiment, the complementary logical signal is constructed from a multi-phase clock.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated in and from a part of this specification, illustrate embodiments of the invention and, together with the description, serve to explain the principles of the invention.

DETAILED DESCRIPTION OF PREFERRED EMBODIMENTS

The various features and advantageous details of the invention thereof are explained more fully with reference to the inventive embodiments that are illustrated in the accompanying drawings and detailed in the following description. However, it will be obvious to one skilled in the art that the present invention may be practiced without these specific details. Descriptions of well-known components and processing techniques are omitted so as not to unnecessarily obscure the invention in detail.

Figure 1:
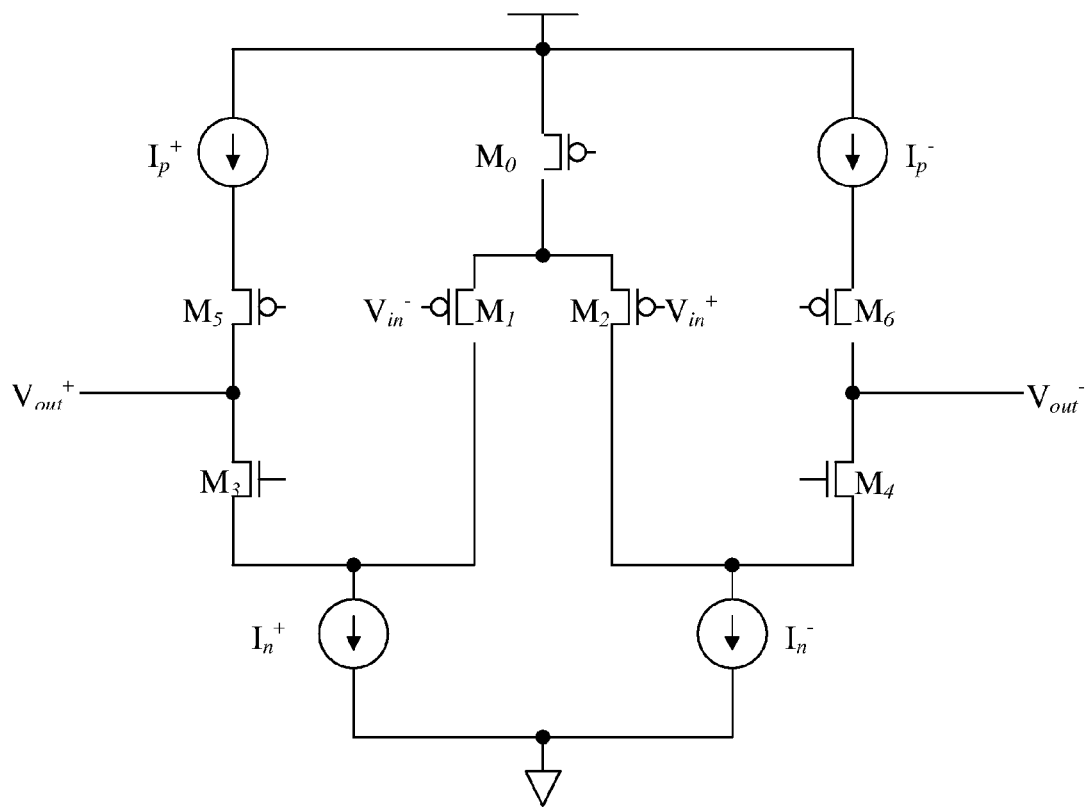
FIG. 1 illustrates a schematic diagram of a conventional operational amplifier using a folded cascode structure.
Figure 2:
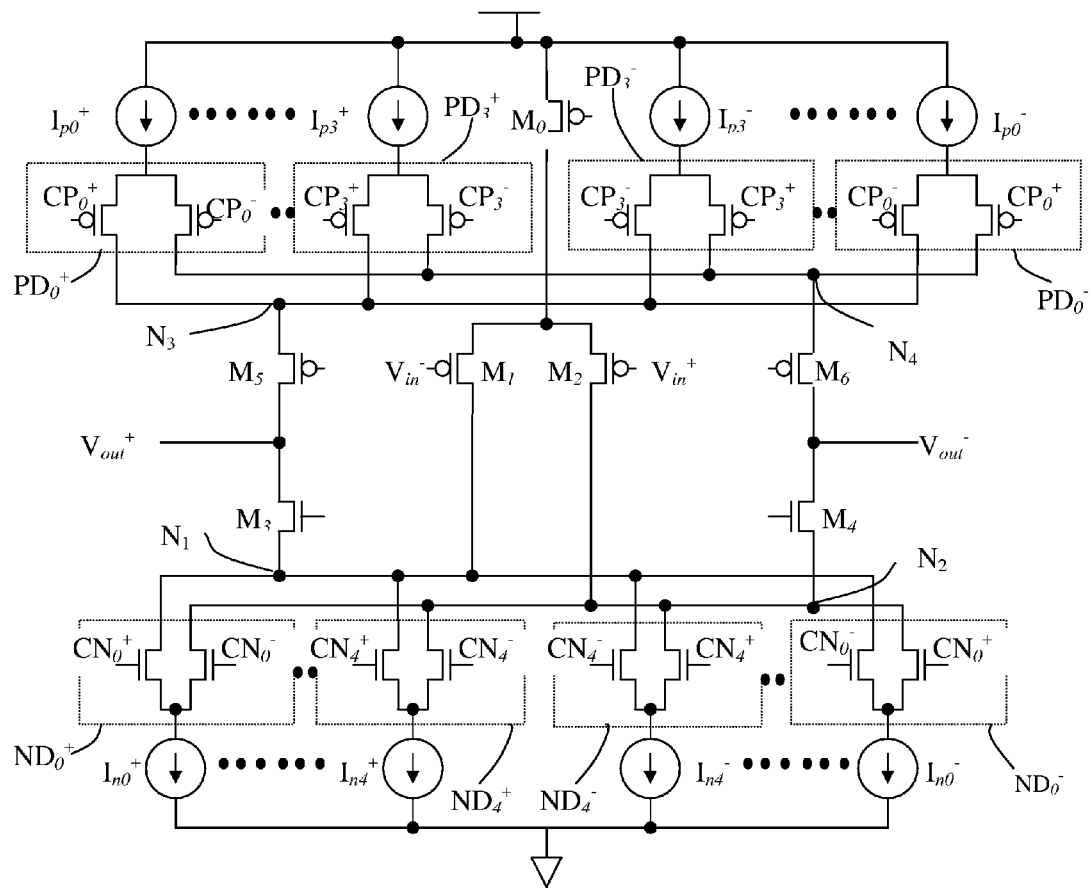
FIG. 2 illustrates a schematic diagram of an operational amplifier in accordance with the present invention.

The present invention is pertaining to a method to alleviate the adverse effect of the flicker noise generated by current sources within an operational amplifier. FIG. 2 shows a schematic diagram of the operational amplifier in accordance with one embodiment of the present invention to illustrate how the method is applied to the prior art operational amplifier of FIG. 1. The operational amplifier of FIG. 2 having four internal circuit nodes $N_1$, $N_2$, $N_3$, and $N_4$ and is identical to the prior art operational amplifier of FIG. 1 except for the following changes. First, the P-type current source pair $I_p^+$ and $I_p^-$ in FIG. 1 are replaced by four P-type current source pairs; the first pair comprises P-type current sources labeled $I_{p0}^+$ and $I_{p0}^-$, and the last pair comprises P-type current sources labeled $I_{p3}^+$ and $I_{p3}^-$. In each of these four P-type current source pairs, one current source is steered to transistor $M_5$ and the other is steered to transistor $M_6$, and the arrangement of the steering is controlled by a pair of complementary logical signals via two differential pairs of transistors. For instance, the first P-type current source pair $I_{p0}^+$ and $I_{p0}^-$ are steered to transistors transistor $M_5$ and $M_6$ via two differential pairs of transistors $PD_0^+$ and $PD_0^-$, and the arrangement of the steering is controlled by a pair of complementary logical signals $CP_0^+$ and $CP_0^-$: when $CP_0^+$ is high (and therefore $CP_0^-$ is low), $I_{p0}^+$ is steered to $M_5$ and $I_{p0}^-$ is steered to $M_6$; when $CP_0^+$ is low (and therefore $CP_0^-$ is high), $I_{p0}^+$ is steered to $M_6$ and $I_{p0}^-$ is steered to $M_5$. Note that using four P-type current source pairs is only an example but not a limitation. In practice, one uses (l+1) P-type current source pairs where l is a positive integer (l=3 in FIG. 2). Second, the N-type current source pair $I_n^+$ and $I_n^-$ in FIG. 1 are replaced by five N-type current source pairs; the first pair comprises N-type current sources labeled $I_{n0}^+$ and $I_{n0}^-$, and the last pair comprises N-type current sources labeled $I_{n4}^+$ and $I_{n4}^-$. In each of these ten N-type current source pairs, one current source is steered to transistor $M_3$ and the other is steered to transistor $M_4$, and the arrangement of the steering is controlled by a pair of complementary logical signals via two differential pairs of transistors. For instance, the first N-type current source pair $I_{n0}^+$ and $I_{n0}^-$ are steered to transistors transistor $M_3$ and $M_4$ via two differential pairs of transistors $ND_0^+$ and $ND_0^-$, and the arrangement of the steering is controlled by a pair of complementary logical signals $CN_0^+$ and $CN_0^-$: when $CN_0^+$ is high (and therefore $CN_0^-$ is low), $I_{n0}^+$ is steered to $M_3$ and $I_{n0}^-$ is steered to $M_4$; when $CN_0^+$ is low (and therefore $CN_0^-$ is high), $I_{n0}^+$ is steered to $M_4$ and $I_{n0}^-$ is steered to $M_3$. Note that using five N-type current source pairs is only an example but not a limitation. In practice, one uses (m+1) N-type current source pairs where m is a positive integer (m=4 in FIG. 2).

The principle of this invention is explained as follows. The P-type current source $I_{p0}^+$ is steered to either $M_5$ or $M_6$, depending on the state of the complementary logical signal pair $CP_0^+$ and $CP_0^-$. The flicker noise associated with the P-type current source $I_{p0}^+$, therefore, is passed to either the positive end of the output $V_{out}^+$ or the negative end of the output $V_{out}^-$, depending on the state of the complementary logical signal pair $CP_0^+$ and $CP_0^-$. The effective noise on the differential output, i.e. $V_{out}^+ - V_{out}^-$, is then the flicker noise multiplied by either 1 or −1, depending on the state of the complementary logical signal pair $CP_0^+$ and $CP_0^-$. This effectively modulates the flicker noise using the complementary logical signal pair $CP_0^+$ and $CP_0^-$. In one embodiment, $CP_0^+$ and $CP_0^-$ are a pair of complementary clock signals whose frequency is higher than the frequency of the signal of interest. In this case, the flicker noise generated by the P-type current source $I_{p0}^+$ is modulated and appears at the output as an out-of-band noise, which does not degrade the integrity of the signal of interest. The same argument applies to all other current sources in FIG. 2 (e.g. $I_{p0}^-$, $I_{p3}^+$, $I_{p3}^-$, $I_{n0}^+$, $I_{n0}^-$, $I_{n4}^+$, $I_{n4}^+$), provided their respective controlling logical signals are high-frequency clock signals.

Figure 3:
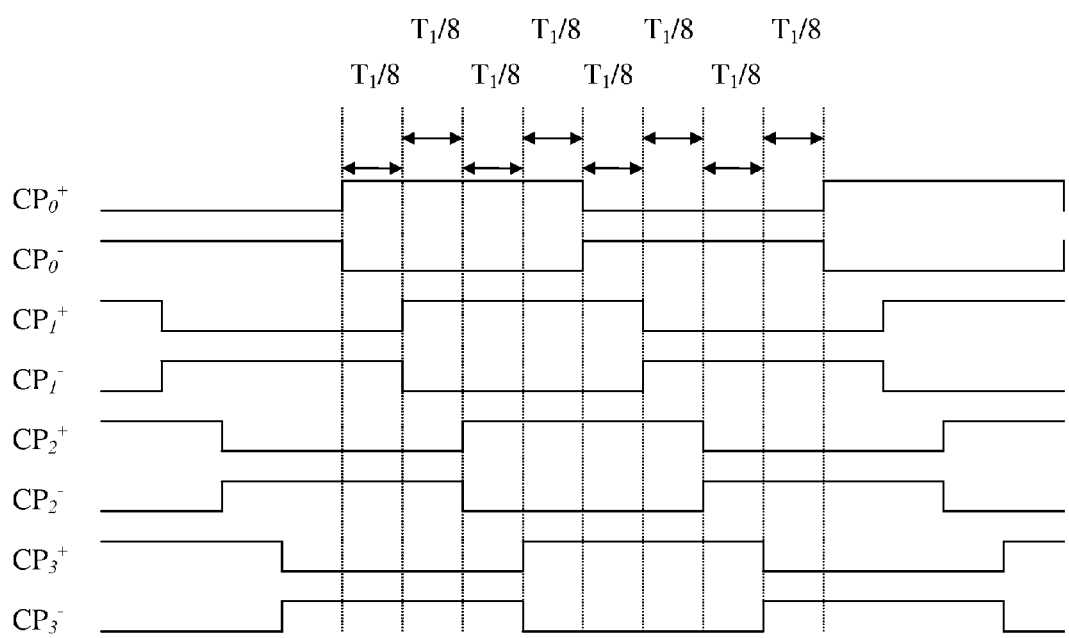
FIG. 3 shows a timing diagram of four complementary logical signals constructed from an 8-phase clock.
Figure 4:
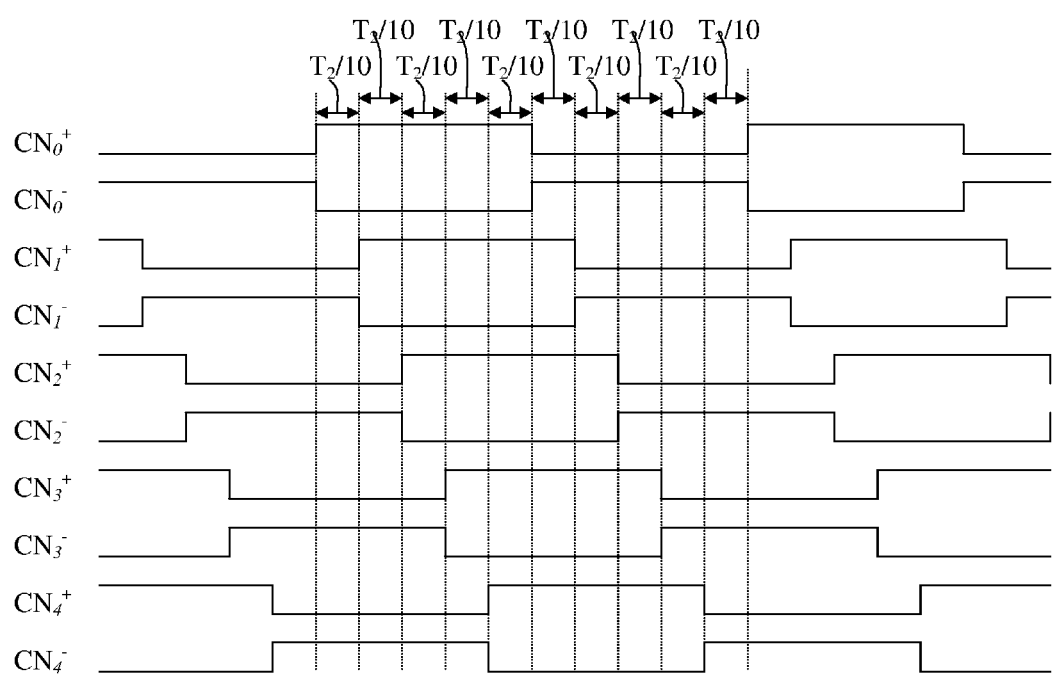
FIG. 4 shows a timing diagram of five complementary logical signals constructed from a 10-phase clock.

In principle, there is no special restriction on how to choose the complementary logical signal pairs that control the steering of the current source pairs, as long as the flicker noise generated by each current source is modulated into an out-of-band noise. There are also no special conditions (on frequencies and phases) that need to be met for the complementary logical signal pairs. It is not absolutely necessary but is highly desirable to use multi-phase clock signals. In a preferred embodiment, a 2×(l+1)-phase clocks are used for the (l+1) P-type current source pairs, and a 2×(m+1)-phase clocks are used for the (m+1) N-type current source pairs. For the exemplary embodiment of the operational amplifier shown in FIG. 2, where l=3 and m=4, an 8-phase clock of a first frequency is used for constructing the four complementary logical signal pairs $CP_0^\pm$ to $CP_3^\pm$ for controlling the four P-type current source pairs $I_{p0}^\pm$ to $I_{p3}^\pm$, respectively, and a 10-phase clock of a second frequency is used for constructing the five complementary logical signal pairs $CN_0^\pm$ to $CN_4^\pm$ for controlling the five N-type current source pairs $I_{n0}^\pm$ to $I_{n4}^\pm$, respectively. Both the first frequency and the second frequency are higher than the frequency of the signal of interest. FIG. 3 depicts an exemplary timing diagram of the four complementary logical signal pairs $CP_0^\pm$ to $CP_3^\pm$ constructed from an 8-phase clock. Here, $T_1$ is the period of the 8-phase clock. FIG. 4 depicts an exemplary timing diagram of the five complementary logical signal pairs $CN_0^\pm$ to $CN_4^\pm$ constructed from a 10-phase clock. Here, $T_2$ is the period of the 10-phase clock. Using such multi-phase clocks is highly desirable, since it makes the current steering occurs uniformly and gradually. In general, using a larger number of current source pairs (i.e. using a larger l or m) leads to a better performance, since the overall current is steered more smoothly. However, the hardware complexity is then higher. Therefore, there is a trade-off between performance and hardware complexity.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. An operational amplifier comprising:
   four internal circuit nodes N1, N2, N3, and N4;
   a differential pair configured for receiving a differential input signal and for steering a first output current and a second output current into N1 and N2, respectively;
   a first circuit branch, coupled between N1 and N3;
   a second circuit branch, substantially identical to the first circuit branch, coupled between N2 and N4;
   a first current-mode circuit comprising a first group of commutable current source pairs controlled by a first group of logical signals, respectively, each commutable current source pair steering two currents either in a straight manner onto N1 and N2, respectively, or in a commutated manner onto N2 and N1, respectively, depending on a state of a respective logical signal; and
   a second current-mode circuit comprising a second group of commutable current source pairs controlled by a second group of logical signals, respectively, each commutable current source pair steering two currents either in a straight manner onto N3 and N4, respectively, or in a commutated manner onto N4 and N3, respectively, depending on a state of a respective logical signal.

2. The operational amplifier of claim 1, wherein the first group of logical signals is formed by a first multi-phase clock and the second group of logical signals is formed by a second multi-phase clock.

3. The operational amplifier of claim 1, wherein the first group of logical signals has the same frequency and differential phase and the second group of logical signals has the same frequency and differential phase.

4. The operational amplifier of claim 1, wherein the frequency of the logical signal is higher than that of the differential input signal.

5. The operational amplifier of claim 1, wherein the flicker noise generated by the operational amplifier is modulated into an out-of-band noise.

6. An operational amplifier for receiving an input signal and for generating an output signal, the operational amplifier comprising a differential pair, a first circuit branch, a second circuit branch, a first current-mode circuit, and a second current-mode circuit; wherein the first current-mode circuit is controlled by a first group of logical signals and the second current-mode circuit is controlled by a second group of logical signals; wherein the frequency of the first group of logical signals is higher than that of the input signal of the operational amplifier and the frequency of the second group of logical signals is higher than that of the input signal of the operational amplifier; wherein the first group of logical signals comprises a plurality of pairs of first complementary logical signals, and the pairs of first complementary logical signals are generated according to a plurality of first multi-phase clock signals.

7. The operational amplifier of claim 6, wherein the second group of logical signals comprises a plurality of pairs of second complementary logical signals, and the pairs of second complementary logical signals are generated according to a plurality of second multi-phase clock signals.

8. The operational amplifier of claim 6, wherein the first group of logical signals has the same frequency and differential phase.

9. The operational amplifier of claim 6, wherein the first group of logical signals has the same frequency and differential phase.

10. The operational amplifier of claim 6, wherein the flicker noise generated by the operational amplifier is modulated into an out-of-band noise.

11. An operational amplifier for receiving an input signal and for generating an output signal, the operational amplifier comprising:

two circuit branches of the same topology and a plurality of current source pairs, wherein: for each current source pair, the two current sources are commutatively steered into the two branches via two sets of differential pair in a manner controlled by a pair of complementary logical signal;

wherein the pair of complementary logical signal is generated according to a plurality of multi-phase clock signals.

12. The operational amplifier of claim 11, wherein the frequency of the pair of complementary logical signal is higher than that of the input signal.

13. The operational amplifier of claim 11, wherein the flicker noise generated by the operational amplifier is modulated into an out-of-band noise.

14. The operational amplifier of claim 11, wherein the pair of complementary logical signal is formed by a first multi-phase clock.

* * * * *